(12) United States Patent
Angle et al.

(10) Patent No.: US 10,564,208 B1
(45) Date of Patent: Feb. 18, 2020

(54) SYSTEMS AND METHODS FOR TESTING CONDUCTIVE MICROWIRE

(71) Applicant: Paradromics Inc., San Jose, CA (US)

(72) Inventors: Matthew Angle, San Jose, CA (US); Yifan Kong, San Jose, CA (US); Edmund Huber, San Jose, CA (US)

(73) Assignee: PARADROMICS, INC., Austin, TX (US)

( * ) Notice: Subject to any disclaimer, the term of this patent is extended or adjusted under 35 U.S.C. 154(b) by 0 days.

(21) Appl. No.: 15/236,122

(22) Filed: Aug. 12, 2016

(51) Int. Cl.
*G01R 31/02* (2006.01)
*H05K 9/00* (2006.01)
*G01R 31/11* (2006.01)

(52) U.S. Cl.
CPC ........ *G01R 31/026* (2013.01); *G01R 31/021* (2013.01); *G01R 31/11* (2013.01); *H05K 9/0058* (2013.01); *H05K 9/0081* (2013.01)

(58) Field of Classification Search
CPC .... G01R 31/026; G01R 31/021; G01R 31/11; H05K 9/0058; H05K 9/0081
USPC .................................................. 324/543, 551
See application file for complete search history.

(56) References Cited

U.S. PATENT DOCUMENTS

| | | | | |
|---|---|---|---|---|
| 5,652,521 A | * | 7/1997 | Meyer | G01R 15/16 324/541 |
| 8,926,823 B2 | * | 1/2015 | Kipouros | G01N 17/02 204/404 |

* cited by examiner

*Primary Examiner* — Farhana A Hoque
(74) *Attorney, Agent, or Firm* — Wilson Sonsini Goodrich & Rosati

(57) ABSTRACT

A system and method for testing the quality of a conductor is disclosed. Specifically, a system of testing a conductor using voltage source generator that is capacitively-coupled through the conductor to voltage detector is disclosed. The voltage source generates a varying voltage signal which induces a voltage signal in the capacitively coupled microwire conductor. The voltage detector that is also capacitively-coupled to the conductor measures the induced voltage. Using the detected voltage signal, the voltage detector determines whether there are any conductive breaks in the conductor.

19 Claims, 11 Drawing Sheets

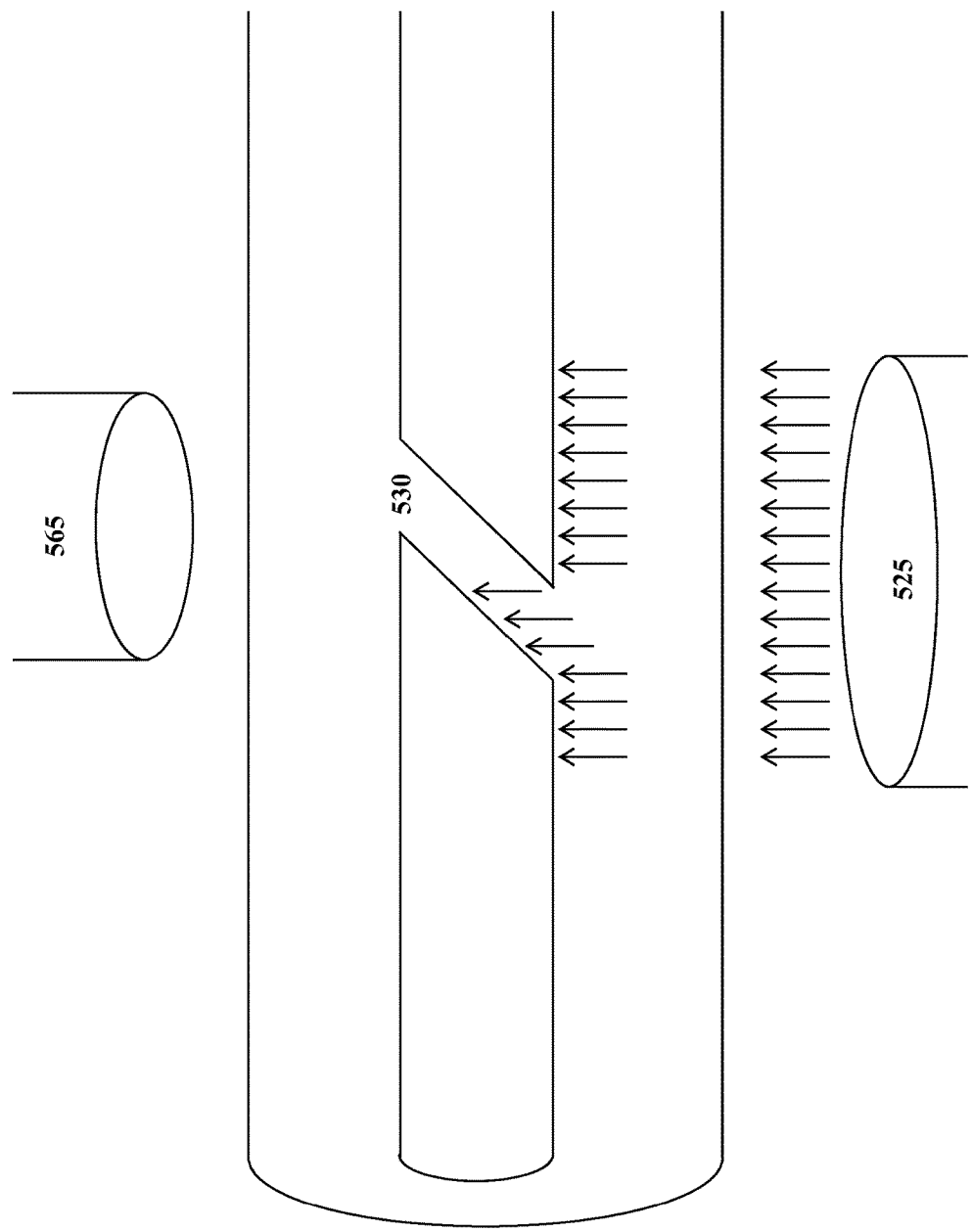

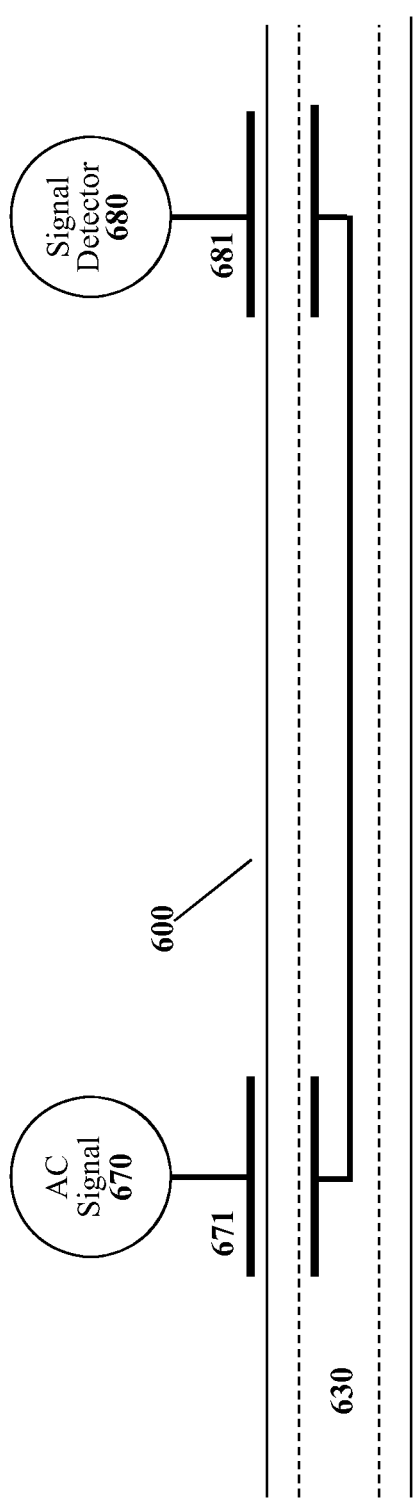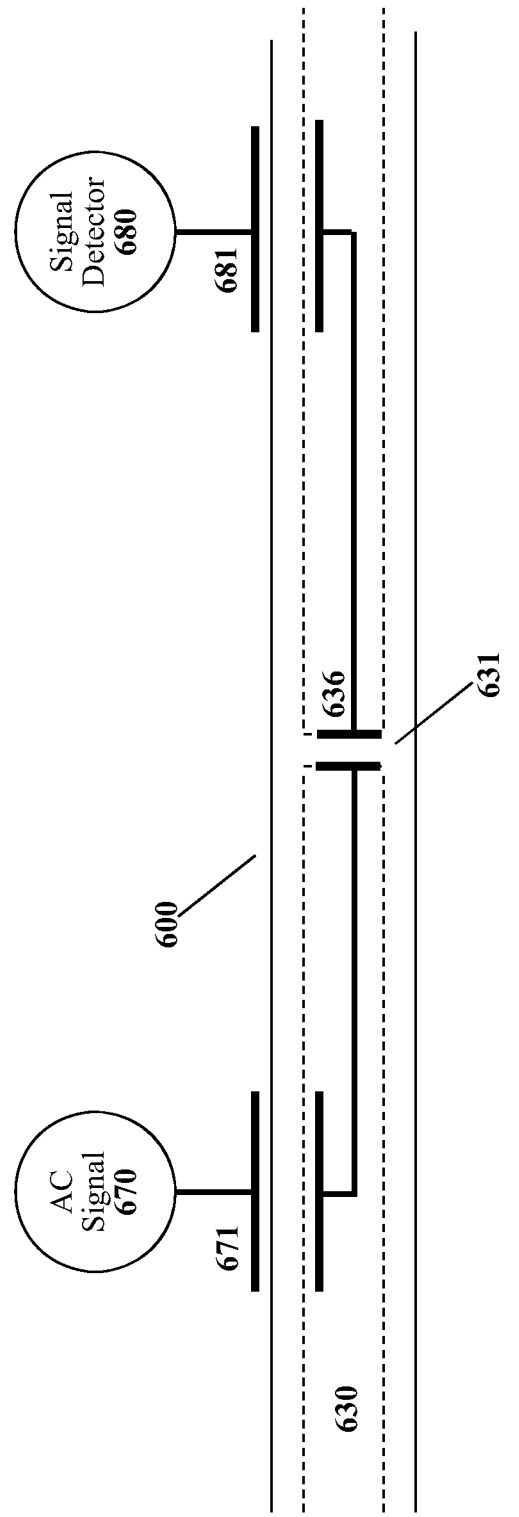
FIG. 6A
FIG. 6B

SYSTEMS AND METHODS FOR TESTING CONDUCTIVE MICROWIRE

STATEMENT AS TO FEDERALLY SPONSORED RESEARCH AND DEVELOPMENT

This invention was made with Government support under contract 5R43MH110287-02 awarded by the National Institutes of Health, and contract N66001-17-C-4005 awarded by the Defense Advanced Research Projects Agency. The Government has certain rights in the invention.

TECHNICAL FIELD

The present invention relates to the field of electronic testing equipment. In particular, but not by way of limitation, the present invention discloses techniques for testing electrical conductors.

BACKGROUND

When building any type of complex product, one must use reliable subcomponents in order to create a final product that will operate properly and operate reliably. Thus, every subcomponent to be used in a complex product should be carefully tested before it is installed into another product.

Wire conductors are used in almost every electronic product. In general, wire conductors are very reliable. However, extremely small diameter wire conductors often contain defects that may cause the extremely small diameter wire conductor to not fully conduct properly or not conduct at all.

Extremely small diameter wires may be created using a process that covers a metal filament with a glass coating in a process known as the "Taylor-Ulitovski process". Using the Taylor-Ulitovski process, one may produce fine glass-coated metal filaments that are only a few micrometers in diameter. These glass-coated metal filaments are often referred to as microwires.

In the Taylor-Ulitovski process, a borosilicate (or other) glass tube contains a cylindrical plug of metal which may be, but is not limited to copper, platinum, or gold or alloys thereof. In most variations of this process, the metal is heated by inducing eddy currents by means of a rapidly-changing magnetic field, typically produced with an electromagnet. The metal is inductively heated to the point that it begins to flow with gravity, and as the melting point of the glass is lower, the molten glass also flows and coats the metal. The glass-coated metal filament that begins to form due to gravity is then spooled and drawn at a carefully controlled tension and speed to yield a given diameter filament. The Taylor-Ulitovski process has several important parameters, including but not limited to magnetic field power, composition of the metal and the glass, pulling tension and speed, and environmental temperature and humidity. The large process parameter space and the process' sensitivity to small changes in those parameters means that expert operators and experience are needed to yield high-quality microwire, and even then discontinuities in the inner conductor of the microwire occur on the order of once per meter or more.

Since the process of creating extremely small diameter microwires is very difficult, the produced microwires may contain minor or significant defects. For some applications, microwires with minor defects can still be used. Significant defects can render a section of microwire useless. Thus, to ensure that any product created with very small diameter microwire operates properly, the microwire should be very carefully tested and graded. It would therefore be desirable to implement systems and methods for testing microwires that can identify defects within the microwire and where those defects are located in the microwire. In this manner, significantly defective sections of microwire can be discarded and sections with minor defects can be graded for applications that can handle the minor defects.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 5 illustrates one embodiment of an optical testing system that attempts to detect discontinuities in microwire by shining light from a light source through the microwire to a light detector.

FIG. 6A illustrates a conceptual diagram of a capacitively-coupled testing system for testing a microwire.

FIG. 6B illustrates a conceptual diagram of a capacitively-coupled testing system that is testing a microwire with a discontinuity.

The FIGs. depict various embodiments for purposes of illustration only. One skilled in the art will readily recognize from the following discussion that other embodiments of the structures and methods illustrated herein may be employed without departing from the described principles.

DETAILED DESCRIPTION

The following detailed description includes references to the accompanying drawings, which form a part of the detailed description. The drawings show illustrations in accordance with example embodiments. These embodiments, which are also referred to herein as "examples," are described in enough detail to enable those skilled in the art to practice the invention. It will be apparent to one skilled in the art that specific details in the example embodiments are not required in order to practice the present invention. For example, although some example embodiments are disclosed with reference to microwire created with the Taylor-Ulitovski process, the same techniques can be used to test other types of conductors created with other types of manufacturing processes. The example embodiments may be combined, other embodiments may be utilized, or structural, logical and electrical changes may be made without departing from the scope what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Computer Systems

Figure 1:
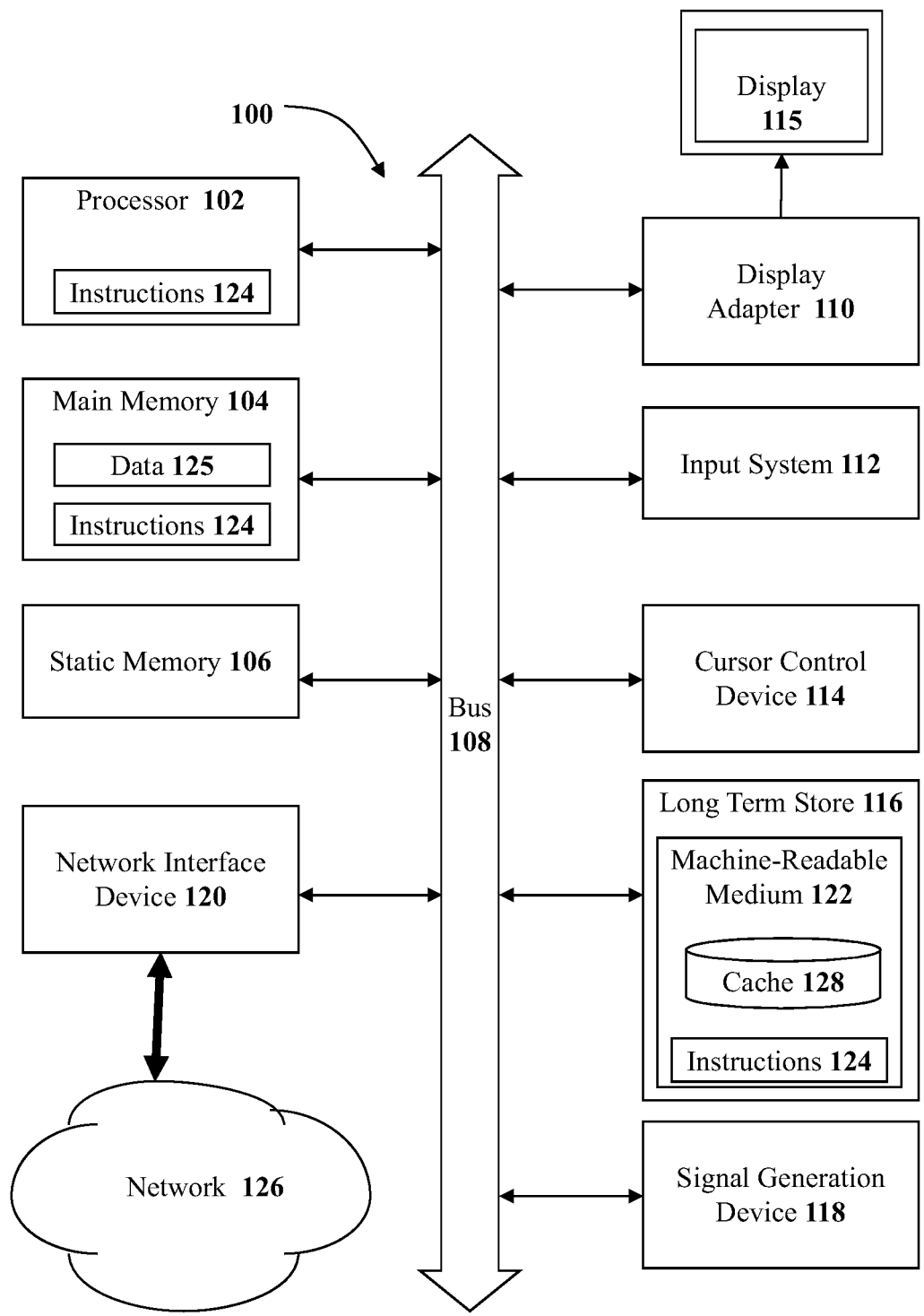
FIG. 1 illustrates a diagrammatic representation of a machine in the example form of a computer system within which a set of instructions, for causing the machine to perform any one or more of the methodologies discussed herein, may be executed.

FIG. 1 illustrates a diagrammatic representation of a machine in the example form of a computer system 100 that may be used to implement portions of the present disclosure. Within computer system 100 there are a set of instructions 124 that may be executed for causing the machine to perform any one or more of the methodologies discussed herein. In a networked deployment, the machine may operate in the capacity of a server machine or a client machine in client-server network environment, or as a peer machine in a peer-to-peer (or distributed) network environment. The machine may be a small card, personal computer (PC), a tablet PC, a set-top box (STB), a Personal Digital Assistant (PDA), a cellular telephone, a web appliance, a network router, switch or bridge, or any machine capable of executing a set of computer instructions (sequential or otherwise) that specify actions to be taken by that machine. Furthermore, while only a single machine is illustrated, the term "machine" shall also be taken to include any collection of machines that individually or jointly execute a set (or multiple sets) of instructions to perform any one or more of the methodologies discussed herein.

The example computer system 100 includes a processor 102 (e.g., a central processing unit (CPU), a graphics processing unit (GPU) or both), a main memory 104 and a static memory 106, which communicate with each other via a bus 108. The computer system 100 may further include a display adapter 110 that drives a display system 115 such as a Liquid Crystal Display (LCD), Cathode Ray Tube (CRT), or other suitable display system. The computer system 100 includes an input system 112. The input system may handle typical user input devices such as a keyboard. However the input system may also be any type of data acquisition system such an analog-to-digital (A/D) converter. The computer system 100 may also include, a cursor control device 114 (e.g., a trackpad, mouse, or trackball), a long term storage unit 116, an output signal generation device 118, and a network interface device 120.

The long term storage unit 116 includes a machine-readable medium 122 on which is stored one or more sets of computer instructions and data structures (e.g., instructions 124 also known as 'software') embodying or utilized by any one or more of the methodologies or functions described herein. The instructions 124 may also reside, completely or at least partially, within the main memory 104 and/or within the processor 102 during execution thereof by the computer system 100, the main memory 104 and the processor 102 also constituting machine-readable media. Note that the example computer system 100 illustrates only one possible example and that other computers may not have all of the components illustrated in FIG. 1 or may have additional components as needed.

The instructions 124 may further be transmitted or received over a computer network 126 via the network interface device 120. Such transmissions may occur utilizing any one of a number of well-known transfer protocols such as the File Transport Protocol (FTP). The network interface device 120 may comprise one or more wireless network interfaces such as Wi-Fi, cellular telephone network interfaces, Bluetooth, Bluetooth LE, Near Field Communication (NFC), etc.

While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein, or that is capable of storing, encoding or carrying data structures utilized by or associated with such a set of instructions. The term "machine-readable medium" shall accordingly be taken to include, but not be limited to, solid-state memories, flash memory, optical media, and magnetic media.

For the purposes of this specification, the term "module" includes an identifiable portion of code, computational or executable instructions, data, or computational object to achieve a particular function, operation, processing, or procedure. A module need not be implemented in software; a module may be implemented in software, hardware/circuitry, or a combination of software and hardware.

In the present disclosure, a computer system may comprise a very small microcontroller system. A microcontroller may comprise a single integrated circuit that contains the four main components that create a computer system: an arithmetic and logic unit (ALU), a control unit, a memory system, and an input and output system (collectively termed I/O). Microcontrollers are very small and inexpensive integrated circuits that are very often used within digital electronic devices. A microcontroller may be integrated along with other functions to create a system on a chip (SOC).

Microwire Manufacturing Overview

Figure 2:
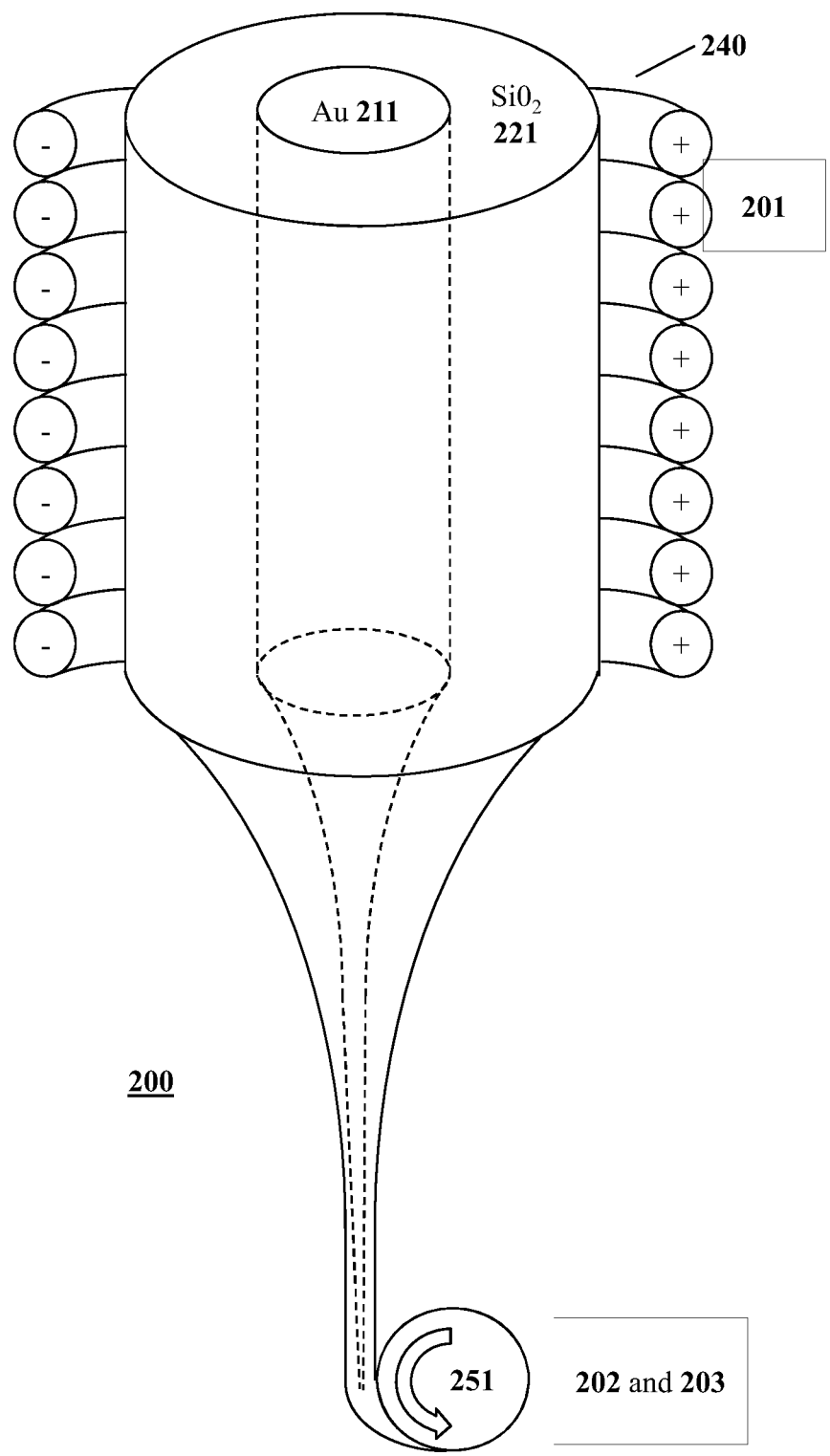
FIG. 2 illustrates a conceptual diagram of the Taylor-Ulitovsky process for creating microwire.

FIG. 2 illustrates a conceptual diagram of the Taylor-Ulitovsky process 200 for creating microwire. As illustrated in FIG. 2, a metal conductive core 211 is surrounded by an insulator material 221 and passed through an electromagnetic coil 240 that heats the metal conductive core 211 and, by contact, the insulator material 221 to form a narrow diameter microwire. In this particular embodiment the metal conductive core 211 is made of gold (Au) and the insulator material 221 is made of Silica glass ($SiO_2$). However, many other types of materials may be used to create microwires. Furthermore, other types of microwire creation processes may also use the teachings of the present disclosure.

As set forth in the background, the technique for manufacturing metal-in-glass microwire using the Taylor-Ulitovsky process is very difficult to control. Referring to FIG.

2, at least three different process parameters of the Taylor-Ulitovsky process should be carefully controlled:

Parameter 201=Control 201 of an electromagnet coil 240 which causes ohmic heating within the metal conductive core 211.

Parameter 202=The pulling tension 202 of a pulling system 251.

Parameter 203=The pulling speed of a pulling system 251.

These three different process parameters (201, 202, and 203) are not independent and their effect on the outcome exhibits hysteresis. Thus, a very careful control system should be used to control these parameters. For example, the computer system 100 of FIG. 1 may receive various inputs from the Taylor-Ulitovsky process 200 to control the process. For example, the computer may receive the temperature created by the electromagnetic coil 240, optical information about the microwire being created, and other measured metrics from the process 200, process those metrics and then control the three different process parameters (201, 202, and 203) in response to the received metrics.

In practice, even under human expert or careful computer control of these three process parameters (201, 202, and 203); the produced microwire tends to have irregularities and discontinuities. On very fine microwires these irregularities and discontinuities can occur on the order of once per centimeter to once per 100 meters or more.

Figure 3:
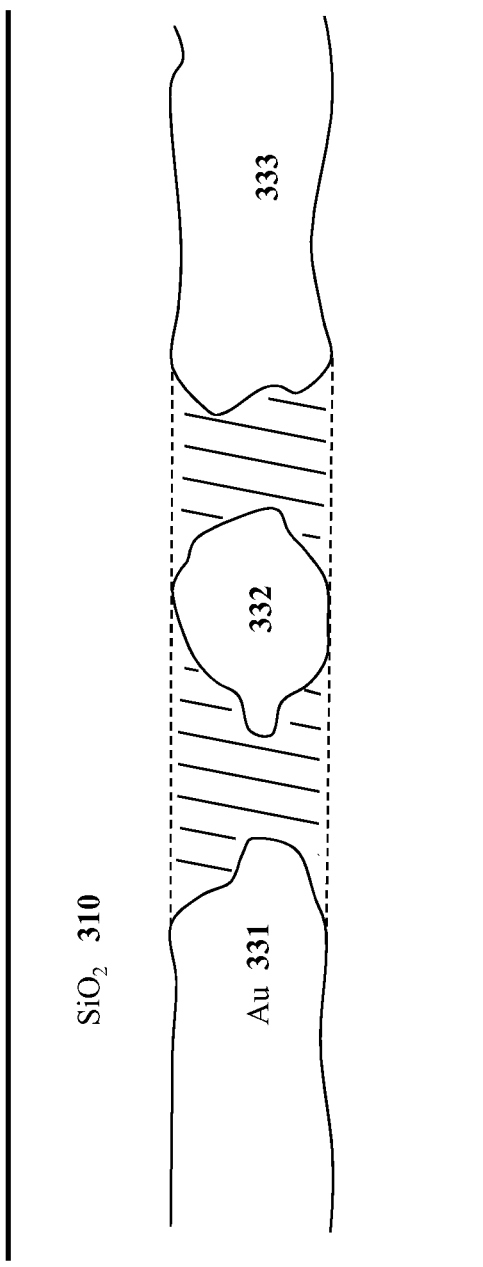
FIG. 3 illustrates a side view of a discontinuity that may occur within a microwire.

FIG. 3 illustrates a side view of a discontinuity that may occur within a microwire. Specifically, the conductor metal 331 within the surrounding insulator 310 is not continuous. Instead there is a first portion of the conductor metal 331, a disconnected piece of conductor metal 332, and second portion of the conductor metal 333. Since there is not a single continuous conductor metal in the microwire, the microwire of FIG. 3 will not be able to conduct a current easily.

Some applications of insulated microwire are tolerant of discontinuities of the microwire in which case conductance between one end and the other end of the microwire can be measured directly. If the conductance is not zero then the microwire may deemed continuous and acceptable for such tolerant applications. Other applications can tolerate some discontinuities but one may still need to know the number discontinuities and the position of the discontinuities for purposes of quality checking, tolerance reporting, rating, etc.

The present disclosure describes a system and techniques for counting the number and position of discontinuities in an insulated microwire with a capacitively-coupled testing system. The disclosed capacitively-coupled testing system can be implemented as a step during the Taylor-Ulitovsky pulling process (illustrated in FIG. 2) to give feedback on the effect of the process parameters (201, 202, and 203). The disclosed capacitive coupled system can also be used during a respooling process for post-production quality control. In yet another embodiment, the disclosed system may be used immediately before a final manufacturing step such as spooling for a microwire bundle in order to determine the number of conducting microwires. Various other different systems have been used for testing microwires. These other testing systems will be described first and can be used in conjunction with the main capacitive coupled system disclosed later in this document.

Conduction Testing of Microwire

One of the most basic ways to detect whether one or more discontinuities are present in a microwire is to simply make a conductive loop of the microwire containing a current source and an ammeter in order to observe whether the ammeter registers any current from the current source. This is the kind of simple conductance measurement that is commonly implemented in digital multimeters.

This simple conductance style of measurement is unsuitable to the task of assessing insulated microwire because since the technique requires that there is direct ohmic contact between the measurement probes and the sample microwire for every microwire segment to be tested. Direct ohmic contact is blocked by the presence of the insulator. It may be useful to sacrifice one batch of microwire to be cut into small segments and tested this way, but that proves to be very labor intensive and inaccurate in light of how much variation the manufacturing process introduces between batches.

Time Domain Reflectometry Testing of Microwire

Figure 4:
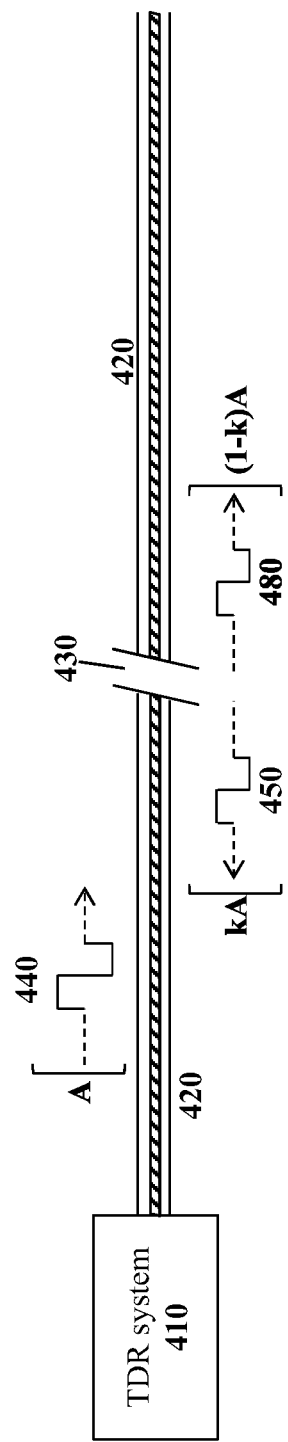
FIG. 4 conceptually illustrates time-domain reflectometry (TDR) being used to test a microwire.

Another method that may be used to test microwire is time-domain reflectometry (TDR). FIG. 4 conceptually illustrates time-domain reflectometry (TDR) being used to test a microwire. Referring to FIG. 4, a voltage test impulse 440 is generated by a TDR system 410 at one of the free ends of the microwire 420 and thus travels down the microwire 420. When the test impulse 440 reaches a (partial) discontinuity 430, a first portion 450 of the test impulse signal is reflected back along the conductor to the impulse source 410 and a second portion 480 continues forward along the conductor according to the resistance of the junction 430. A time-of-flight measurement against the reflection(s) 450 can localize one or more discontinuities in the microwire.

The variability of the Taylor-Ulitovsky process for manufacturing insulated microwire limits the effectiveness of time-domain reflectometry (TDR) for testing the microwire. Non-discontinuity types of irregularities present in the conductive core of the microwire (such as variations in conductor thickness) may create many complex signal reflections that make TDR measurements difficult. Furthermore, this time-domain reflectometry (TDR) method also requires ohmic contact to one end of the microwire. This adds both complexity and limits the ability of the time-domain reflectometry (TDR) method to detect multiple breaks in a single microwire.

Optical Testing of Microwire

Optical inspection of microwires may be performed under a high magnification microscope in attempts to determine the location and number of discontinuities within a microwire. Optical testing requires a high magnification system, a very sophisticated optical signal processing system (sophisticated compared with direct electrical measurement) and ultimately it is only a secondary measure of conductivity. Conductivity is the critical function of the microwire and the reason for testing for discontinuities in the first place such that a secondary system is not ideal.

FIG. 5 illustrates one optical testing system embodiment that attempts to detect discontinuities by shining light from a light source 525 through the microwire being tested to a light detector 565. When there is a large discontinuity in the conductive core of the microwire, the light detector 565 will detect more light shining through the microwire.

However, a discontinuity such as discontinuity 530 that comprises overlapping sections of conductor that are not physically continuous as illustrated in FIG. 5 may appear fine but will not conduct a signal properly. Thus, optical systems for testing microwires are at best a partial solution for testing microwires.

Overview of Dynamic Capacitive Testing of Microwire

The present disclosure proposes using a capacitance-coupled testing system for testing microwires for discontinuities such that no direct contact to the microwire is required for the testing system. FIGS. 6A and 6B illustrate a conceptual diagram of a capacitance-coupled system for testing microwires.

Referring to the conceptual diagram of FIG. 6A, the microwire segment 600 under test can be viewed as a series of resistors of negligible resistance (not shown). Two elements of the capacitance-coupled testing system are capacitively-coupled to the microwire segment 600. A signal generator 670 is capacitively-coupled to the microwire 600 though capacitive-coupling 671 and a voltage detector 680 is capacitively-coupled to the microwire 600 though capacitive-coupling 681.

Referring to the conceptual diagram of FIG. 6B, one or more discontinuities in the conductor core 630 of microwire 600 behave electrically as one or more capacitors, due to the discontinuities forming parallel plate junctions. This number of capacitors in series simplifies to the series capacitance 636.

The system of the present disclosure uses a signal generator 670 to introduce a varying (AC) electrical field at one point in the test microwire 600 through a capacitive coupling 671. The varying electric field will be carried by the conductor core 630 in the microwire segment 600. A capacitively-coupled voltage detector 680 at a second point on the test microwire 600 records the electrical field detected. In the event of a discontinuity in the conductor core 630, the lower capacitance leads to a frequency-dependent attenuation of the AC signal carried between the signal generator 670 and the voltage detector 680. In this manner, a discontinuity in the conductor core 630 of the microwire segment 600 can be detected. Since the capacitively-coupled testing system disclosed in FIGS. 6A and 6B requires no direct contact, the microwire can be moved during testing operation. By determining when discontinuities are detected as the microwire 600 passes through the capacitively-coupled testing system, the testing system can derive the number, location, and severity of the discontinuities in the tested microwire.

Shielded Dynamic Capacitive Testing of Microwire

In a preferred embodiment, some or all portions of the capacitively-coupled testing system may be housed within a box made of a conductive material in order to shield the measurements from environmental electromagnetic fields and electromagnetic radiation. It is important to shield against stray capacitances but also electromagnetic radiation because the microwires can act as small antennas.

Figure 7:
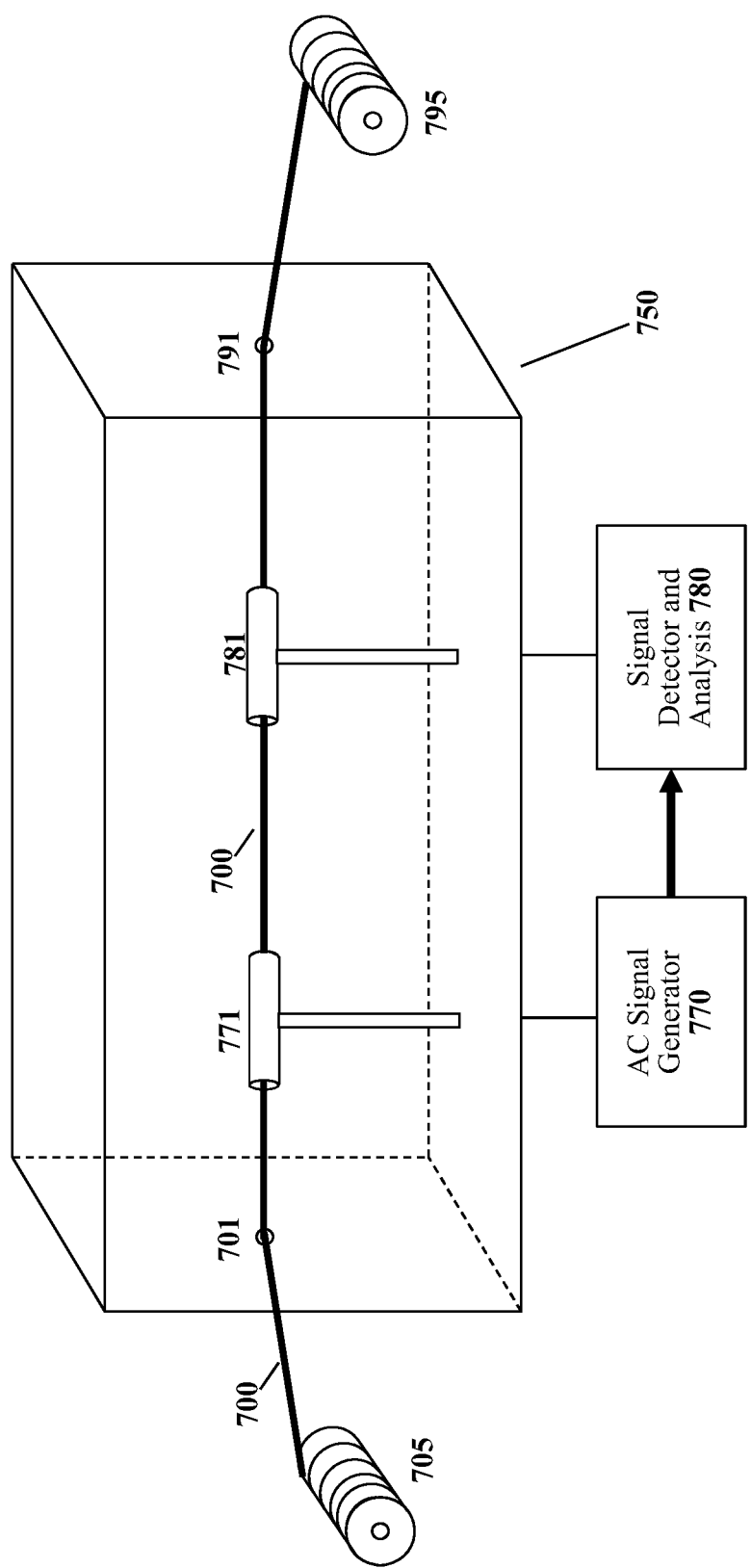
FIG. 7 illustrates a diagram of one embodiment with an electromagnetic shielding box.

FIG. 7 illustrates a diagram of one capacitive-coupled testing system embodiment with an electromagnetic shielding box 750. The microwire unreels from a first spool 705 and enters the shielding box 750 through a first pinhole 701. After the testing section, the microwire later exits electromagnetic shielding box 750 through a second pinhole 791 bored into the electromagnetic shielding box 750 and then wrapped around second spool 795. The pinholes 701 and 791 (and the capacitive tubes 771 and 781) may incorporate a smoothed funnel guide in order to minimize damage to the microwire under test. In another embodiment (not shown), the spools 705 and 795 are enclosed within the electromagnetic shielding box to further reduce electromagnetic interference with the microwire testing.

Inside the electromagnetic shielding box 750, the microwire is threaded through two capacitive tubes (771 and 781). The capacitive tubes (771 and 781) are used to make a capacitive coupling between the measurement instruments (770 and 780) and the conductor core of the microwire 700. The capacitive tubes (771 and 781) are separated by a distance large enough to ensure that one capacitive tube does not affect the electric field of the second capacitive tube considerably.

A first capacitive tube 771 is coupled to an alternating current (AC) signal generator 770 that drives at least one AC voltage signal. In a preferred embodiment, a number of AC signals are generated in a spread frequency manner. The AC signal generator 770 is also connected to the detector system 780 such that the AC signal generator 770 and detector system 780 can coordinate when AC signals are generated and detected. The second capacitive tube 781 is also connected to the detector system 780. The AC signal generator 770 may also be electrically connected to the detector system 780 through a voltage divider or potentiometer that is digitally controlled (not pictured). The detector system 780 may consist of several voltage sensors (such as analog-to-digital converters) and implements a detection algorithm for determining the number and severity of discontinuities on the current segment of microwire given the voltage inputs.

The detection algorithm in the detector system 780 carefully analyzes the phase and magnitude differences between the original AC signal frequencies transmitted by AC signal generator 770 and the capacitive measurement made by the detector system 780.

Capacitive Tubes for Capacitive-Coupling to Microwire

Figure 8:
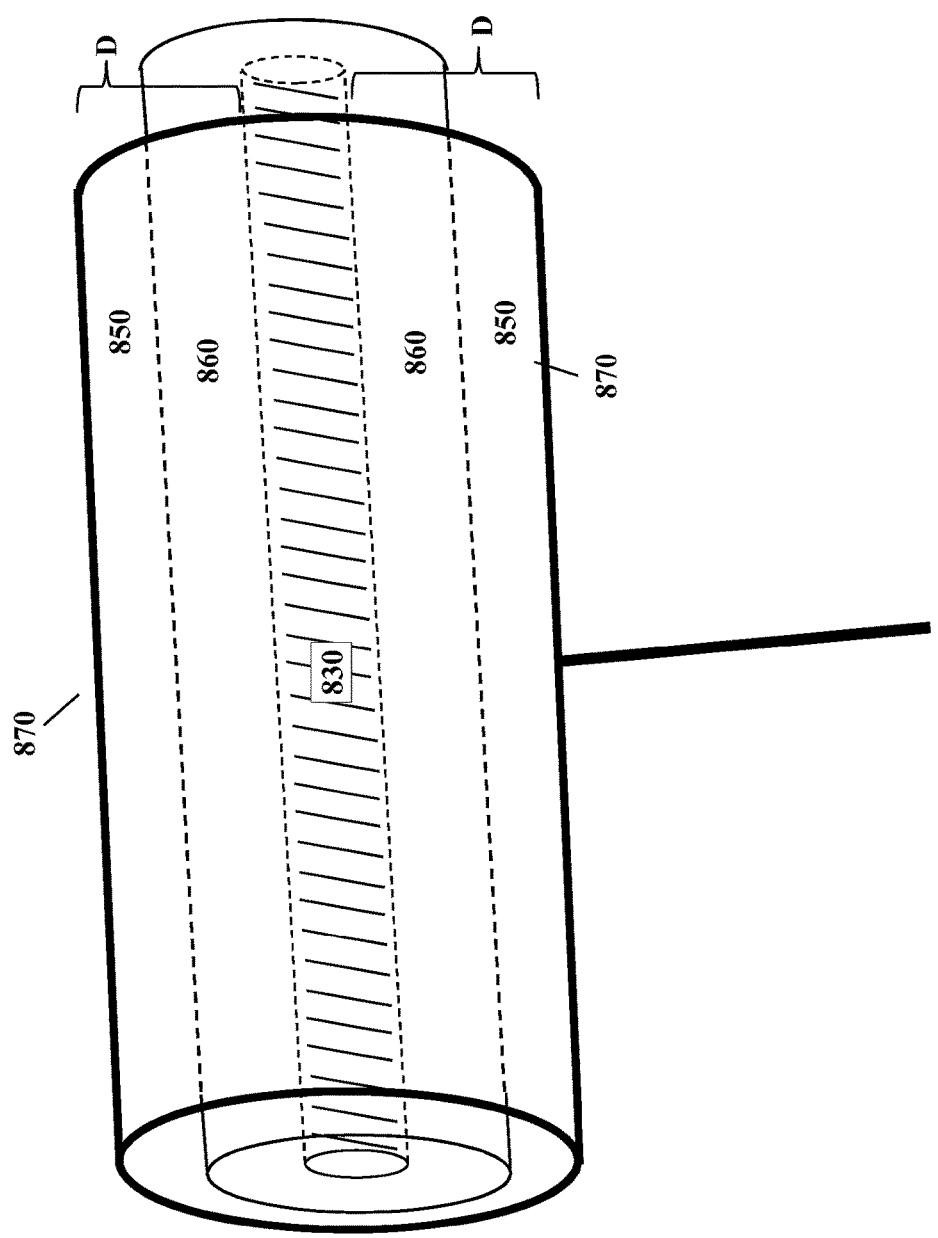
FIG. 8 illustrates an enlarged diagram of a capacitive tube with a microwire passing through the capacitive tube.

FIG. 8 illustrates an enlarged diagram of a capacitive tube with a microwire passing through the capacitive tube. One principle of operation for the disclosed testing system is that the capacitive tube 870 and the inner conductive core 830 of the microwire form the inner and outer rings (plates) of a coaxial capacitor. These coaxial capacitors are illustrated conceptually as capacitors 671 and 681 on FIGS. 6A and 6B.

Referring back to FIG. 8, the intervening air 850 and microwire insulator 860 serve as the dielectric for the coaxial capacitor. The capacitive tubes have an inner bore diameter close to the outer diameter of the insulated microwire being tested. This ensures that the distance "D" between the two rings (plates) of the coaxial capacitor is minimized and thus the capacitance of the coaxial capacitor is maximized. As this capacitance is maximized, the sensitivity of the microwire testing system is higher.

Alternative Capacitive-Coupled Testing of Microwire

Figure 9:
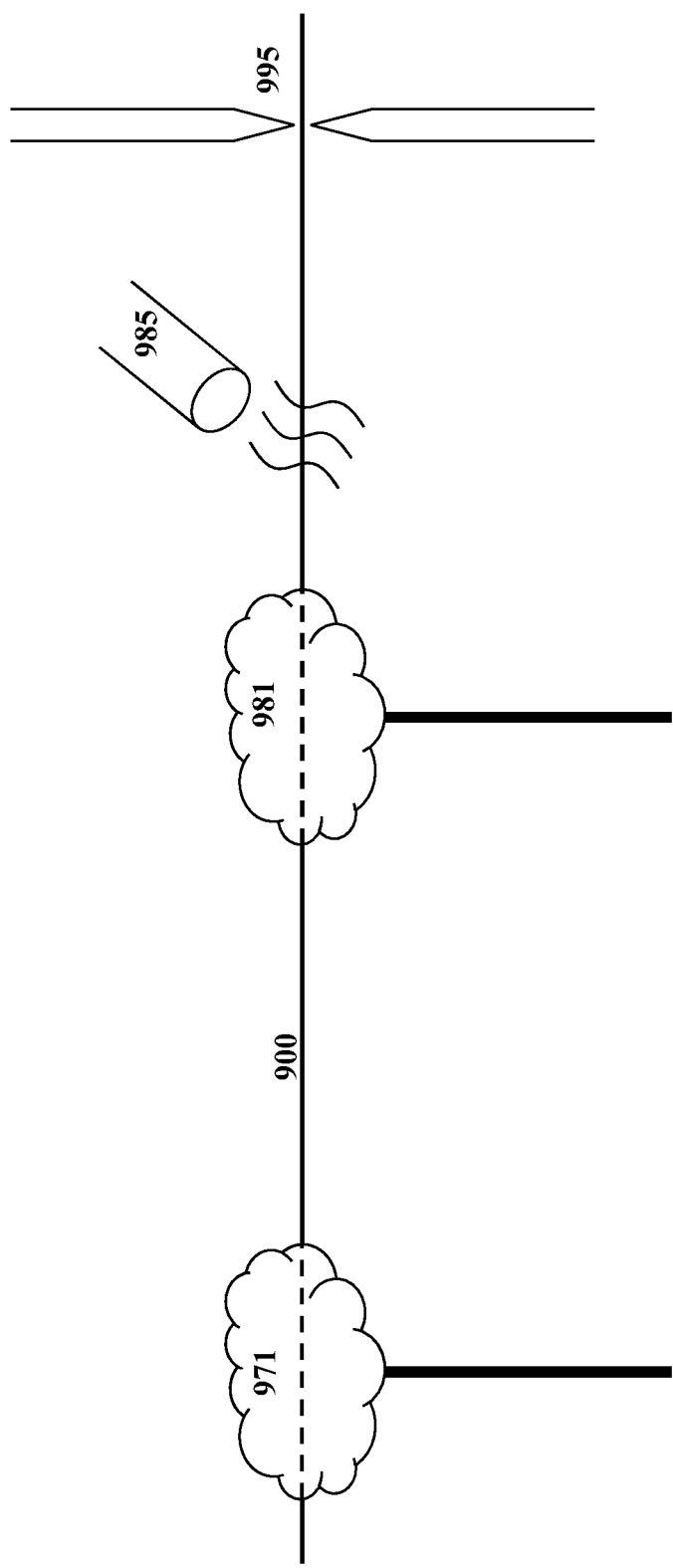
FIG. 9 illustrates an alternative embodiment for capacitively-coupled microwire testing system that uses a sponge soaked with an electrolyte solution for capacitive coupling.

FIG. 9 illustrates an alternative embodiment for capacitively-coupled system for testing microwire. In the alternative embodiment of FIG. 9, the capacitive tubes 771 and 781 of FIG. 7 may be replaced by sponges 971 and 981. The sponges 971 and 981 are soaked with an electrolyte that will act as the outer ring of a coaxial capacitor. The electrolyte solution may comprise salty water.

The arrangement of FIG. 9 ensures that the distance "D" between the outer ring (the electrolyte solution) and the inner ring (the conductive core of the microwire 900) of the capacitive coupling is minimal. In such an embodiment, a drying element 985 such as an absorbent pad, heating element, and/or air flow is employed to remove the electrolyte solution from the microwire such that a direct electrical connection between the two sponges is not formed. The microwire may also be drawn through a small hydrophobic aperture 995 to remove the electrolyte solution from the microwire 900.

Capacitive-Coupled Testing System Details

For the purposes of signal to noise (thermal, mechanical, etc.) ratio, the amplitude of the generated input signal is selected to be as high as possible while not causing dielectric breakdown of the microwire insulation. In an embodiment with $SiO_2$ glass insulation, the generated AC signal should therefore be less than 125 Volts RMS to avoid the breakdown of $SiO_2$ glass. In one embodiment, the original generated AC signal will be on the order of 10 Volts.

The generated input AC signal(s) may be generated by an oscillating signal source that may be implemented as a simple crystal oscillator amplifier circuit. The generated AC input signal(s) may also be generated by using an off-the-shelf voltage waveform generator. The generated AC input signal may be one frequency-sweeping signal or may be the sum of several sine waveforms of different frequencies. In one embodiment, the frequencies used range between 1 kHz and 100 kHz.

Figure 10A:
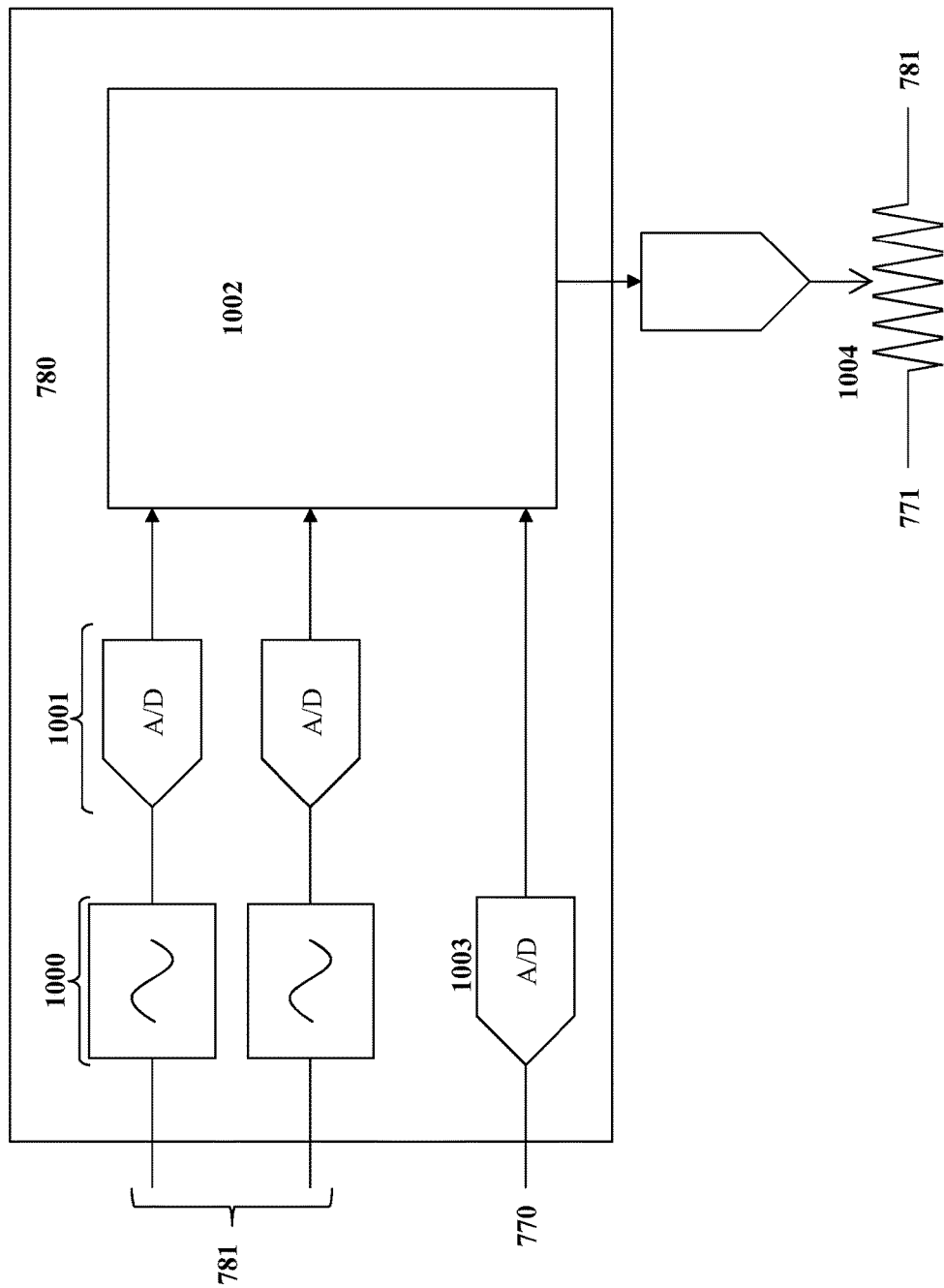
FIG. 10A illustrates a block diagram of a first embodiment of a signal detector and analysis system.

FIG. 10A illustrates a block diagram of a first embodiment of a signal detector and analysis system 780. The detector system of FIG. 10A may consist of a bank of phase-preserving analog bandpass devices 1000 that feed into a bank of analog-to-digital converters 1001. The bank of analog-to-digital converters 1001 are polled by a digital device 1002. Banks of order two are illustrated in the embodiment of FIG. 10A but the banks may be of any order 2 and above.

Figure 10B:
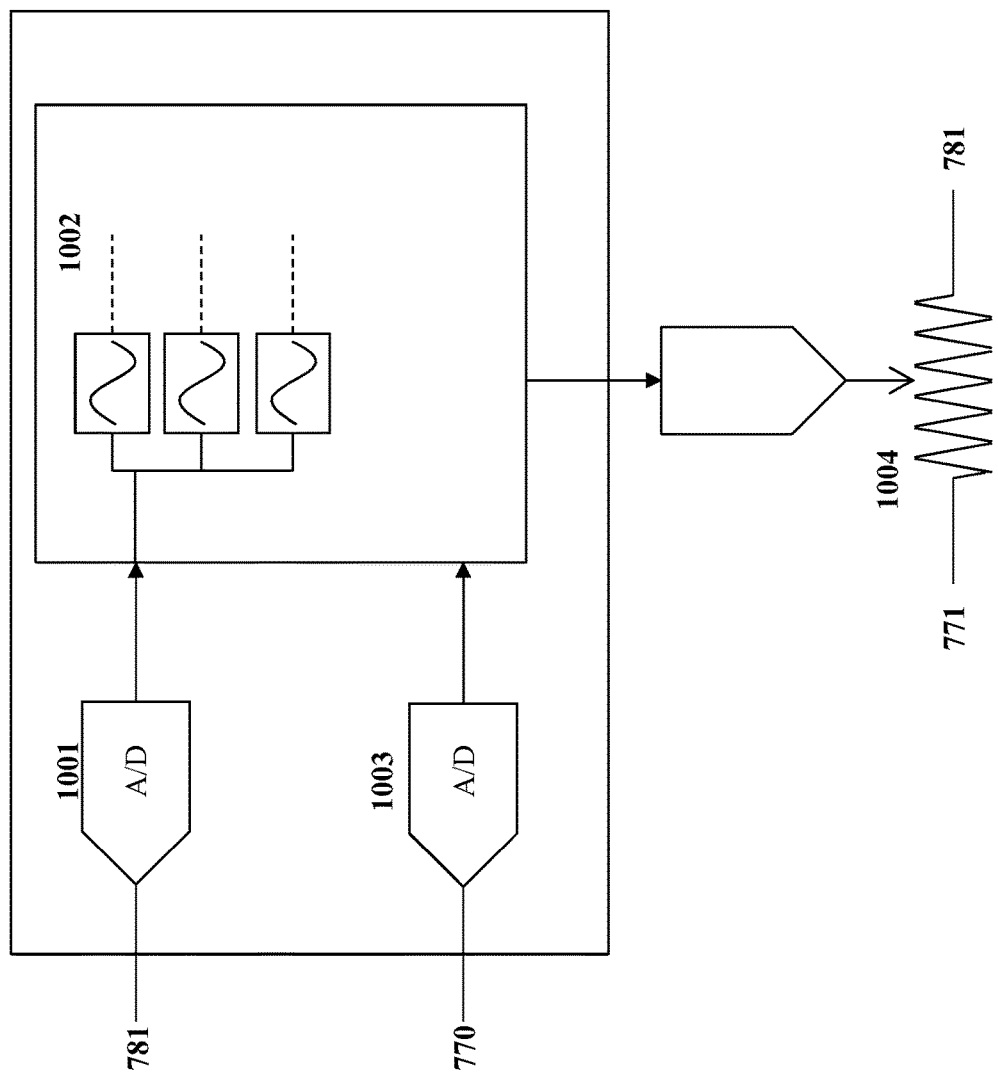
FIG. 10B illustrates a block diagram of a second embodiment of a signal detector and analysis system.

In an alternative embodiment illustrated in FIG. 10B, there may be only one analog-to-digital converter 1001 that is polled by a digital device 1002. The digital device 1002 implements the filtering performed by the analog devices in the embodiment of FIG. 10A before performing its analysis. In another embodiment (not shown), instead of filtering the input signal 1001 for a specific set of frequencies, a time-to-frequency-and-phase-domain conversion such as the Fourier transform may be applied.

The detector system 780 also digitizes the original generated AC input signal(s) from signal generator 770 using analog-to-digital converter 1003 and provides these input(s) to the digital device 1002. The digital device 1002 controls a voltage-controlled resistor 1004 that electrically connects the coupling capacitors 771 and 781. The voltage-controlled resistor 1004 may be implemented with a field effect transistor in ohmic mode, with a prepackaged commercial IC, or with any other suitable means.

The size of a discontinuity in the microwire may be characterized by measuring its capacitance. A large discontinuity has a smaller capacitance than a smaller discontinuity. A series of discontinuities will behave as a single, larger capacitance summed from the individual capacitances. The analysis system uses the fact that a discontinuity will strongly attenuate at a frequency given by its RC constant and above, and the fact that a discontinuity will phase-shift the input signal in order to measure the capacitance and thus the severity of the discontinuity.

The digital device 1002, in addition to its other functions, implements an algorithm wherein the transfer function of the RC circuit formed by the measurement equipment and the microwire is characterized by inspecting the response of said RC circuit as measured through 781, compared to the input to said RC circuit as communicated by 770. The algorithm may operate over several digital inputs as illustrated in FIG. 10A. Alternatively, the algorithm may be the second step in digital processing after a single input signal has been analyzed for frequency-specific content as illustrated in FIG. 10B.

An ideal RC circuit behaves as a high-pass filter with a single inflection point in its transfer function, determined by the RC constant. Ideally, the discontinuities in the microwire may be represented as a single summed series capacitance, but in practice they may behave as RC circuits in series. Therefore the transfer functions may be more complex and more resolution may be required to characterize the discontinuities well. Given the real-world constraints of sampling frequency and the resultant Nyquist rate, as well as computational power limitations, a frequency sweep may be insufficient to characterize the test microwire.

To enhance the sensitivity of the measurements, the algorithm also sweeps R through control of voltage-controlled resistor 1004, altering the RC constant, which compresses the RC response in some frequencies while expanding it in others. Since the capacitances have remained constant, it is possible to normalize the frequency sweeps at different R values and to compose a combined higher-resolution transfer function which would be sufficient for making precise determinations about the discontinuities in the test microwire.

The dynamic capacitive-coupled testing system of the present disclosure may be combined with other testing systems in order to obtain better results.

The preceding technical disclosure is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. § 1.72(b), which requires that it allow the reader to quickly ascertain the nature of the technical disclosure. The abstract is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A testing system for testing an insulated conductor, said testing system comprising the elements of:
    a first capacitive coupling to said insulated conductor;
    a signal generator for generating an original signal on said first capacitive coupling thereby inducing a second signal on said insulated conductor;
    a second capacitive coupling to said insulated conductor; and
    a signal detector comprising (i) a bank of band pass devices, (ii) a bank of analog-to-digital-converters coupled to said bank of band pass devices, and (iii) a digital device for processing digital data read from said bank of analog-to-digital-converters,
    said signal detector detecting said second signal on said insulated conductor through said second capacitive coupling, said signal detector analyzing the phase and magnitude differences between original signal and the second signal to determine discontinuities on said insulated conductor.

2. The testing system for testing an insulated conductor as set forth in claim 1 wherein said first capacitive coupling comprises a capacitive tube.

3. The testing system for testing an insulated conductor as set forth in claim 1 wherein said first capacitive coupling comprises a combination of a low impedance electrode and a sponge with electrolyte solution, where the electrolyte solution forms an electric bilayer around the wire insulation an electric field is established between the bulk solution and conductive wire core.

4. The testing system for testing an insulated conductor as set forth in claim 3 wherein said electrolyte solution comprises a saline solution.

5. The testing system for testing an insulated conductor as set forth in claim 3 wherein said testing system further comprises:
a drying element for drying said electrolyte solution off insulated conductor after passing through said sponge.

6. The testing system for testing an insulated conductor as set forth in claim 1 wherein said signal generator generates an AC spread frequency signal.

7. The testing system for testing an insulated conductor as set forth in claim 1 wherein said signal detector further comprises:
a voltage-controlled resistor to adjust an RC constant.

8. The testing system for testing an insulated conductor as set forth in claim 1 wherein said signal detector comprises:
a bank of analog-to-digital-converters; and
a digital device for processing digital data read from said bank of analog-to-digital-converters wherein said digital device performs digital filtering.

9. The testing system for testing an insulated conductor as set forth in claim 8 wherein said signal detector further comprises:
a voltage-controlled resistor to adjust an RC constant.

10. A method for testing an insulated conductor, said method for testing said insulated conductor comprising:
generating an original signal;
inducing a second signal on said insulated conductor with said original signal through a first capacitive coupling;
detecting said second signal on said insulated conductor through a second capacitive coupling;
analyzing the phase and magnitude differences between original signal and the second signal to determine discontinuities on said insulated conductor;
converting said second signal to a digital signal with a bank of analog-to-digital-converters coupled to a bank of band pass devices; and
processing said digital signal read from said bank of analog-to-digital-converters using a digital device.

11. The method for testing an insulated conductor as set forth in claim 10 wherein said first capacitive coupling comprises a capacitive tube.

12. The method for testing an insulated conductor as set forth in claim 10 wherein said first capacitive coupling comprises a sponge with electrolyte solution.

13. The method for testing an insulated conductor as set forth in claim 12 wherein said electrolyte solution comprises a saline solution.

14. The method for testing an insulated conductor as set forth in claim 12 wherein said method further comprises:
drying said electrolyte solution off insulated conductor after passing through said sponge.

15. The method for testing an insulated conductor as set forth in claim 10 wherein said signal generator generates an AC spread frequency signal.

16. The method for testing an insulated conductor as set forth in claim 10 wherein said second signal is filtered using said bank of band pass devices prior to converting said second signal to said digital signal.

17. The method for testing an insulated conductor as set forth in claim 16 wherein said method further comprises:
adjusting a voltage-controlled resistor to adjust an RC constant.

18. The method for testing an insulated conductor as set forth in claim 10 wherein said digital device is a digital filter, and wherein said digital signal read is processed using said digital filter to create a filtered digital signal.

19. The method for testing an insulated conductor as set forth in claim 18 wherein said method further comprises:
adjusting a voltage-controlled resistor to adjust an RC constant.

* * * * *